United States Patent [19]
Joiner et al.

[11] Patent Number: 4,672,014
[45] Date of Patent: Jun. 9, 1987

[54] EXPOSURE OF IMAGING SHEETS UTILIZING A LIGHT VALVE AS A WAVELENGTH TRANSFORMER

[75] Inventors: Charles W. Joiner, Dayton; Dale R. Shackle, Springboro, both of Ohio

[73] Assignee: The Mead Corporation, Dayton, Ohio

[21] Appl. No.: 785,428

[22] Filed: Oct. 8, 1985

[51] Int. Cl.$^4$ ............................ G03C 5/16; G03F 9/00
[52] U.S. Cl. .................................... 430/20; 430/138
[58] Field of Search ................................ 430/20, 138

[56] References Cited

U.S. PATENT DOCUMENTS

| | | | |
|---|---|---|---|
| 3,666,881 | 5/1972 | Stein | 178/5.4 |
| 3,756,718 | 9/1973 | Letzer | 355/32 |
| 3,761,171 | 9/1973 | Fields | 430/20 |
| 3,803,408 | 4/1974 | Assouline et al. | 250/213 |
| 3,824,002 | 7/1974 | Beard | 350/160 |
| 3,829,684 | 8/1974 | Assouline et al. | 250/213 |
| 4,008,962 | 2/1977 | Nepper | 355/77 |
| 4,090,219 | 5/1978 | Ernstoff et al. | 358/59 |
| 4,191,456 | 3/1980 | Hong et al. | 353/31 |
| 4,230,405 | 10/1980 | Kurtz | 355/4 |
| 4,288,822 | 9/1981 | Hareng et al. | 358/296 |
| 4,375,647 | 3/1983 | Mir | 358/75 |
| 4,399,209 | 8/1983 | Sanders et al. | 430/138 |
| 4,440,846 | 4/1984 | Sanders et al. | 430/138 |
| 4,494,865 | 1/1985 | Andrus et al. | 355/32 |

*Primary Examiner*—Richard L. Schilling
*Attorney, Agent, or Firm*—Biebel, French & Nauman

[57] ABSTRACT

A method and apparatus for exposing an imaging sheet to form a latent image in a layer of photosensitive microcapsules on the surface of the imaging sheet utilizes wavelength or frequency transformation of light images representative of the latent image, which transformation is performed by a light valve. An original document, including images which are to be transferred to an imaging sheet, is illuminated by visible light which is directed upon and controls the light valve, such that actinic radiation illuminating the light valve is modulated in accordance with the visible light; the modulated actinic radiation is directed upon the imaging sheet to form a latent image therein. In this way, the original document may be illuminated by visible light which is effectively wavelength or frequency transformed by the light valve into actinic radiation, typically in the ultraviolet range.

7 Claims, 6 Drawing Figures

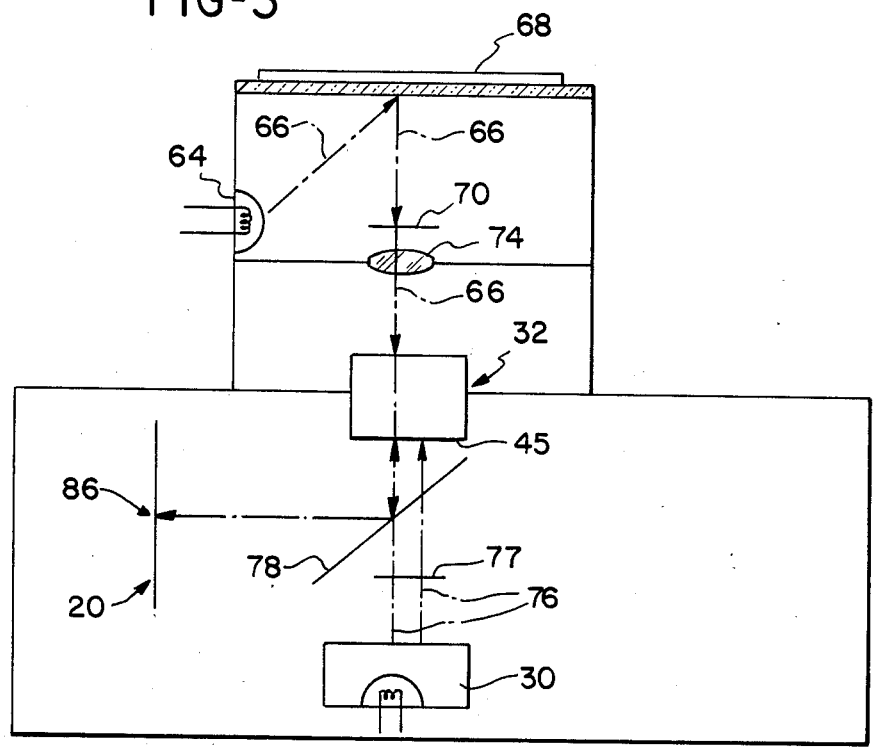
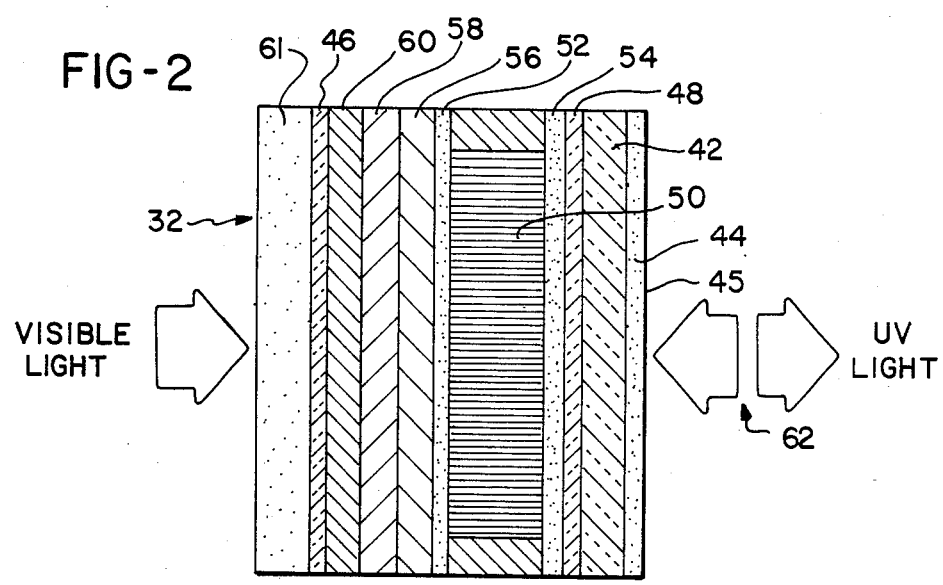

EXPOSURE OF IMAGING SHEETS UTILIZING A LIGHT VALVE AS A WAVELENGTH TRANSFORMER

BACKGROUND OF THE INVENTION

This invention relates to a method and apparatus for exposing imaging sheets of the type described in U.S. Pat. Nos. 4,399,209 and 4,440,846 to The Mead Corporation, which are incorporated herein by reference. More particularly, it relates to a method and apparatus for exposing these imaging sheets by means of a light valve which functions as a wavelength or frequency transformer means.

U.S. Pat. Nos. 4,399,209 and 4,440,846 describe an imaging system wherein a photosensitive layer comprising microcapsules containing a photosensitive composition in the internal phase is image-wise exposed to actinic radiation and subjected to a uniform rupturing force whereupon the microcapsules image-wise rupture and release the internal phase. The imaging system is particularly advantageous because it is a dry imaging system and does not rely upon the application of wet development processing solutions to develop the image. An image-forming chromogenic material, such as a substantially colorless color former, is typically associated with the microcapsules either in the internal phase or otherwise. When the microcapsules image-wise rupture, the released or activated color former reacts with a developer material and produces an image. U.S. Pat. No. 4,399,209 discloses a transfer system wherein the developer is provided on a separate sheet to which a transfer of the color former is made, and U.S. Pat. No. 4,440,846 discloses a self-contained system wherein the developer is on the surface of the imaging sheet with the microcapsules.

Presently, imaging materials prepared in accordance with the teachings of the referenced Mead patents are ultraviolet sensitive and tend to have absolute sensitivities in the range of about 100 to 10,000 ergs/$cm^2$. These imaging sheets cannot be used to copy printed documents by reflection imaging using conventional radiation sources because they have very little sensitivity to visible light. A conventional ultraviolet source such as a fluorescent tube cannot be used to copy documents by reflection imaging because many documents are printed on papers which incorporate pigments, such as $TiO_2$, which absorbs ultraviolet radiation. Thus, there is a need for a photocopy apparatus which is useful in imaging the Mead imaging material.

SUMMARY OF THE INVENTION

A principal object of the present invention is to provide an improved method and apparatus for exposing imaging sheets employing a layer of photosensitive microcapsules.

Another object of the present invention is to provide an improved method and apparatus for exposing an imaging sheet by means of ultraviolet radiation.

In accordance with this invention, a light valve imaging apparatus is used to expose the imaging sheets described in the above referenced patents with actinic radiation while simultaneously illuminating (reading) the document to be copied with visible light. In one embodiment, a light valve, such as that described in U.S. Pat. No. 3,824,002 to Beard (1974), is used as a wavelength or frequency transformer means for converting visible, non-actinic, radiation into actinic radiation which is directed onto the imaging sheet to produce the latent image.

As indicated above, one of the problems involved in exposing the imaging sheets is that many documents are printed on papers which absorb ultraviolet radiation. In the light valve arrangement of the present invention, visible light is used to illuminate an original document. The light reflected by the original document constitutes a first light signal. The first light signal is converted or transformed into corresponding signal of actinic radiation using a light valve. The light valve includes an electro-optical material such as a nematic liquid crystal, which is activatable between birefringent and isotropic states. The visible light signal is projected onto the light valve. This in turn impresses an electric signal on the light valve which produces an image in the electro-optical layer in the form of isotropic and birefringent areas. In this state the light valve modulates incident actinic radiation. The modulated radiation is selectively transmitted to the imaging sheet where a latent image, in the form of hardened and unhardened microcapsules is formed.

One embodiment of the present invention resides in an improved method for exposing an imaging sheet having a layer of microcapsules on the surface thereof to form latent images in the imaging sheet. The microcapsules contain a photosensitive composition which undergoes a change in viscosity in areas exposed to actinic radiation, e.g., ultraviolet radiation or blue light, e.g., 380 to 480 nm.

In accordance with another embodiment of the invention, multiple (full) color images may be reproduced. For multiple color images, multiple light sources or light filtering is performed such that the visible light signal is made up of successive three or four component signals. These component images are typically red, green and blue; or red, green, blue and black component images. The source of actinic radiation illuminating the image converting light valve provides three or four distinct frequency ranges which are synchronized with the three or four distinct component signals.

Another embodiment of the present invention resides in an apparatus for exposing an imaging sheet comprising image illuminating means for generating a visible light signal representative of latent image to be formed in an imaging sheet; means for generating actinic radiation to which imaging sheets are sensitive; a light valve responsive to the visible light signal and capable of modulating the actinic radiation; and means for directing the modulated actinic radiation onto an imaging sheet. For full color imaging, the apparatus additionally includes means for successively providing component visible light signals and means for synchronizing the frequency range of the actinic radiation with the aforesaid means.

Other objects and advantages of the invention will be apparent from the following description, the accompanying drawings and the appended claims.

BRIEF DESCRIPTION OF THE DRAWINGS

FIGS. 1A and 1C illustrate an imaging sheet which may be exposed in accordance with the present invention, while

FIG. 2 is an enlarged cross-section through a light valve which may be used in the present invention.

FIG. 3 is a schematic diagram of apparatus in accordance with the present invention.

DETAILED DESCRIPTION OF THE INVENTION

Figure 1A:
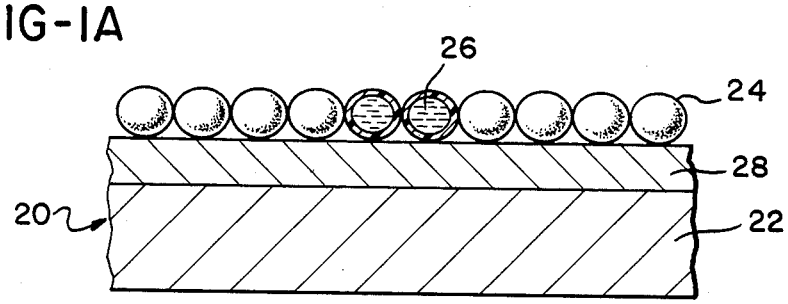

An imaging sheet which is exposed in accordance with the method and apparatus of the present invention is shown in FIG. 1. In FIG. 1A, a self-contained imaging sheet 20 is shown. The imaging sheet 20 comprises a substrate 22 coated with a layer of microcapsules 24. The microcapsules 24 are filled with an internal phase 26 containing a photosensitive material. Typically, a chromogenic material, such as a color forming agent, is also contained within the microcapsules 24 or otherwise associated with the microcapsules. The imaging sheet 20, shown here, is a self-contained sheet in that a developer material 28 is provided as a layer interposed between the substrate 22 and the microcapsules 24. The developer material 28 reacts with the chromogenic material associated with or contained within the microcapsules 24 to produce an image when the capsules 24 are ruptured. Since the present invention is concerned with exposing an imaging sheet to form a latent image in the imaging sheet, it will be apparent that it is equally applicable to transfer systems in which the developer is on a separate sheet which is assembled with the imaging sheet 20 after exposure. Both forms of imaging sheets are more fully described in the referenced patents.

If the imaging sheet 20 is a full color imaging sheet, there are three or four sets of microcapsules 24 on the surface of the sheet. Each set of microcapsules is formed with different photosensitive materials such that each set of microcapsules is sensitive to a different frequency range of actinic radiation. In this way, when the imaging sheet is exposed to different frequency ranges or wavelengths of actinic radiation (for example, three bandwidths of UV radiation designated UV-1, UV-2, and UV-3, see FIGS. 5 and 6), the microcapsules can be selectively hardened. Typically, three sets are used which respectively contain cyan, magenta and yellow color formers. In the case of a four color system, a set of microcapsules containing a black color former is also included on the surface of the imaging sheet.

Figure 1B:
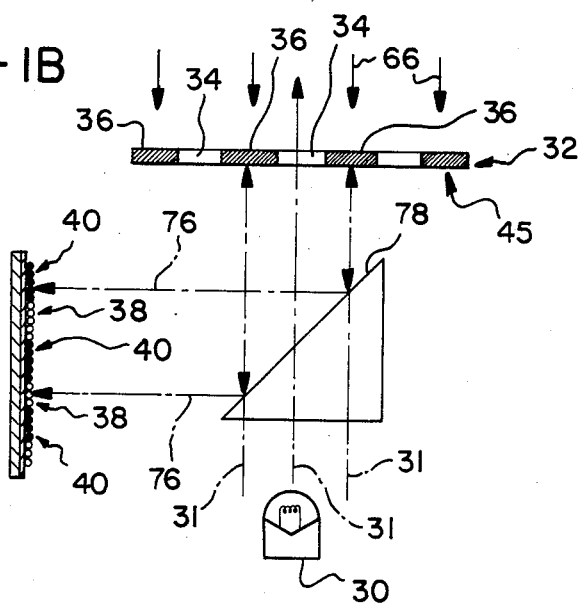
FIG. 1B illustrates such a sheet during exposure.

The imaging sheet 20 is shown in FIG. 1B as it is being exposed by a source 30 of radiant energy, preferably, ultraviolet radiation, which is positioned directly below the surface of an electro-optical element or light valve 32. The imaging sheet 20 is positioned, as shown, to one side out of the direct path 31 of the ultraviolet radiation. The light valve 32 is schematically shown as having isotropic light transmitting areas or elements 34 and birefringent light shielding or deflecting areas or elements 36. For this illustration, it will be presumed that the photosensitive material in the internal phase 26 of the microcapsules 24 is a radiation curable material and, hence, the imaging sheet 20 is positive working. Exposure of the imaging sheet 20 solidifies the internal phase 26 in the exposed areas 40, whereas the internal phase 26 remains viscous in the unexposed areas 38.

Figure 1C:
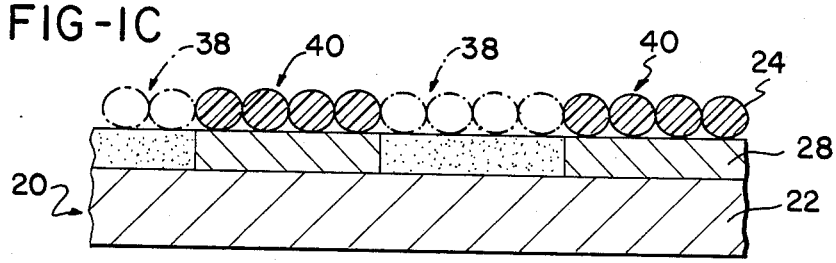

FIG. 1C illustrates a portion of the imaging sheet 20 after the microcapsules 24 have been exposed and then ruptured, typically by a uniform rupturing force. For simplicity, the microcapsules 24 are shown as being ruptured in unexposed areas 38 and unruptured in exposed areas 40. In actuality, all or a portion of the microcapsules 24 may also be ruptured in the exposed areas 40; however, due to the polymerization of the internal phase 26, they do not release or activate the color former. In the unexposed areas 38, the chromogenic material and the developer 28 react to form a visible image 29. There may also be areas of intermediate exposure; however, to simplify the illustration, these areas are not shown in the drawing. In such areas, some of the microcapsules 24 rupture and release the internal phase 26 or, as a result of partial polymerization of the internal phase 26, only a portion of the internal phase 26 is released.

The most typical example of the photosensitive material used in the imaging sheet 20 includes an ethylenically unsaturated compound and a photoinitiator, however, negative-working photolysable systems are also useful. These compositions are sensitive to ultraviolet radiation and relatively insensitive to visible light. Consequently, the imaging apparatus most useful in the present invention relies upon an ultraviolet source 30.

In the case of full color imaging systems, the sets of microcapsules 24 and, more correctly, the photosensitive compositions contained therein, have distinct sensitivities to ultraviolet radiation or blue light (e.g., wavelengths from 380 nm to 480 nm). Imaging sheets useful in full color imaging are the subject of commonly assigned U.S. patent applications Ser. No. 339,917, filed Jan. 18, 1982, and Ser. No. 620,994, filed June 15, 1984, which are incorporated herein by reference.

Any of a number of known light valves can be used in the present invention. A cross-section of a typical light valve is shown in FIG. 2 and consists of a glass layer 42 with an anti-reflective coating 44, two transparent conductor layers 46,48, a liquid crystal layer 50 between two inert insulating layers 52,54, a dielectric mirror 56, a light-blocking layer 58, a photoconductor 60 and a fiber optic face plate 61. Actinic radiation incident face 45 of the light valve passes a polarizer which may be incorporated in layer 42 or in coating 44 or be a separate element.

The liquid crystal light valve 32 utilized in the present invention is a thin film sandwich with an alternating current (AC) voltage applied across it. It consists of a cadmium sulfide photosensor layer 60, a liquid crystal layer 50 and several other thin films. The photosensor 60 detects a low level input light image and impresses a replica voltage pattern on the liquid crystal 50 or other electro-optical material.

The voltage pattern of the visible light image on the liquid crystal 50 electrically alters the optical properties of the layer between isotropic and birefringent state. The light valve 32 performs this function at near video rates while maintaining the resolution and gray scale quality of the image.

Between the liquid crystal 50 and photosensor 60, a combination of a light-blocking layer 58 and a dielectric mirror 56 is placed to isolate the input and output radiation. The dielectric mirror 56 serves to reflect the output radiation 62 back through the liquid crystal 50, and the light-blocking layer 58 prevents residual output radiation leakage to the photosensor 46. Actinic radiation incident face 45 is polarized. Radiation incident isotropic areas is reflected by dielectric mirror 56 and passes the polarizer. Radiation incident birefringent areas is phase shifted and does not pass the polarizer. The actinic radiation is thereby modulated.

Figure 4:
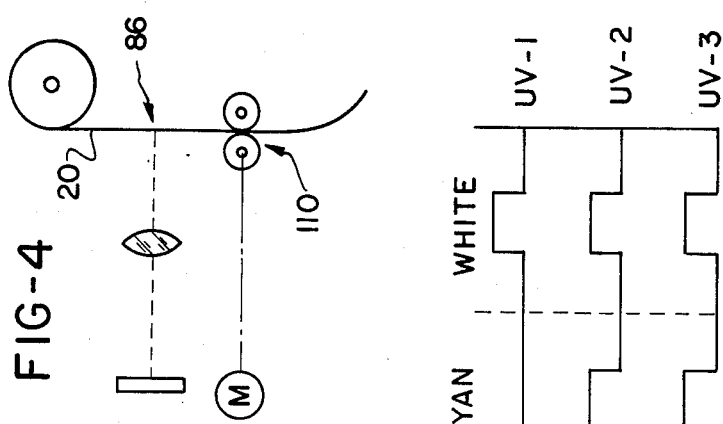
FIG. 4 illustrates one application of the present invention wherein a continuous web of imaging material is exposed as it is moved or scrolled past an exposure station.

As shown in FIG. 3, an individual light valve 32 is addressed by the visible radiation 66 from the visible radiation source 64. This light addressing is performed by visible radiation 66 being reflected from an original document 68 and directed or focused onto the light valve 32. An electric image is impressed on the light valve causing it to assume image-wise isotropic states 34 or birefringent states 36 as shown in FIG. 1B. Ultraviolet radiation emanating from a separate ultraviolet radiation source 30 is directed or focused onto the opposite side of the light valve 32 through a polarizer on face 45 of the light valve 32. The ultraviolet radiation reflected from the isotropic areas 34 of the light valve passes the polarizer, is deflected via beam splitter 78 and focused on the imaging sheet 20. Ultraviolet radiation reflected from birefringent areas 36 is phase shifted, blocked by polarizer 37, and not transmitted to the imaging sheet Those skilled in the art will understand that the present invention can be carried out by projecting an entire image of the original document on a light valve or by projecting the original document line-by-line on a linear light valve array. Both types of light valve constructions are known in the art. FIG. 4 shows an embodiment of the present invention wherein the imaging sheet 20 is supplied in roll form such that a web of the imaging material can be scrolled across an exposure station as each line of the imaging sheet is exposed. If the imaging sheet is exposed as an individual sheet, a platen or drum may be provided on which the sheet is mounted by such means as a vacuum and carried across the exposure station as is well known in the art.

Light valve imaging apparatus can be classified based on the nature of the electro-optical element which forms the light valve 32. Among the electro-optical elements known in the art are ferro-electric ceramics such as PLZT (lanthanum doped lead zirconate titanate) and smectic or nematic liquid crystals. The operation of these materials is similar, however, the voltage levels required to activate a ferro-electric ceramic are high, and therefore, these materials may be difficult to adapt for use in the present invention. Liquid crystal light valves are preferred.

The operation of the present invention in the formation of full color images is now explained with reference to FIGS. 1B and 3. Visible radiation 66 is emitted from the visible radiation source 64, directed upon and reflected from an original document 68. The reflected visible radiation is filtered through a three color filter wheel 70 and focused by a lens 74 upon the light valve 32 or light valve array. Filters of each of the three principal colors red, green and blue are rotated through the reflected visible radiation 66 in a timed sequence. For example, if there is red, green and blue colors present on the document 68, when the red filter is in place, the reflected green and blue light will be filtered out and only red colored radiation will be allowed to pass through the filter onto the light valve 32. The red radiation will then impress a image on the light valve 32 to form isotropic areas 34 (see FIG. 1B) where the red color is present on the document 68. Similar passage of the blue and green light will be effected when those filters are sequenced into the reflected light 66.

Ultraviolet radiation 76 is emitted from the radiation source 30. The ultraviolet radiation 76 must be in distinct frequency bands of radiation which are synchronized and coordinated with the three color filter wheel 70 such that ultraviolet radiation corresponding to each of the three colors is emitted during the time that a given color of light is focused on the light valve 32. It will be apparent that a filter or diffraction grating 77 can be used for generation of the corresponding distinct frequency bands of ultraviolet radiation or the radiation source 70 can comprise multiple sources which are electronically sequenced.

In the illustrative embodiments, the ultraviolet radiation 76 strikes the light valve 32 on the side opposite the visible radiation 66. When the ultraviolet radiation 76 strikes the light valve 32, it either passes through one of the isotropic elements 34 and is reflected back to a beam splitter 78 through polarizer 37 which directs it onto the imaging sheet 20 or it passes through the birefringent elements 36 and is rotated and blocked by the polarizer on face 45.

During operation of the present invention, a document 68 is placed in the apparatus 62 such that visible radiation 66 is reflected off the face of the document 68 through a tri-color wheel 70 comprised of a red, green and blue component onto a light valve 32.

As the radiation 66 from the visible light source 64 is reflected by the document 68 through the red filter of the three color filter 70 into the light valve 32, the blue and green components are absorbed by the red filter and red light is emitted onto the light valve 32. Simultaneously, the UV-1 wavelength 106 which corresponds to the red visible radiation wavelength 104 is emitted onto the opposite side of the light valve 32, see FIG. 5. The actinic radiation 76/106, UV-1, reflected from the portions of the light valve 32 corresponding to the red areas of the original document is transmitted to the corresponding portions of the imaging sheet 20 as explained with reference to FIG. 3. When the UV-1 wavelength 106 strikes the imaging sheet 20, the cyan component 80 of the microcapsules 24 becomes hardened. The magenta 82 and yellow 84 components remain viscous so that, upon subjecting the imaging sheet 20 to rupturing forces, the magenta 82 and yellow 84 components react with the developer to form a composite red image on the imaging sheet 20.

A large variety of such image processing techniques are well known in the art and can be applied to the present invention. The radiation emitted by the ultraviolet source 30 is synchronized with the tri-color wheel 70 such that, when the red filter is used to filter the visible radiation, UV-I is being emitted to the light valve array 63; when the radiation 66 from the document 68 is being filtered thrugh the green filter, UV-II is being emitted to the light valve array 63; and, finally, when the radiation 76 from the document 68 is being filtered by the blue filter, UV-III is being emitted to the light valve array 63. This process may be performed for the entire sheet or on a line-by-line basis until the entire document 68 has been scanned and the appropriate corresponding portions of the imaging sheet 20 have been exposed to the appropriate ultraviolet radiation 76.

Figure 5:
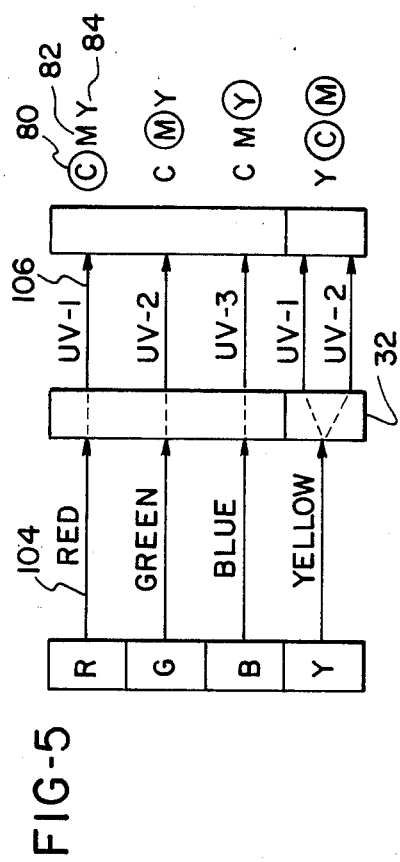
FIG. 5 illustrates the wavelength or frequency transformation of the present invention which is performed by the light valve.

It is apparent from FIG. 5 that a similar reaction takes place for green and blue colors. Additionally, if the document contains white portions, all three ultraviolet wavelengths are reflected onto the imaging paper such that all three color components are hardened.

Figure 6:
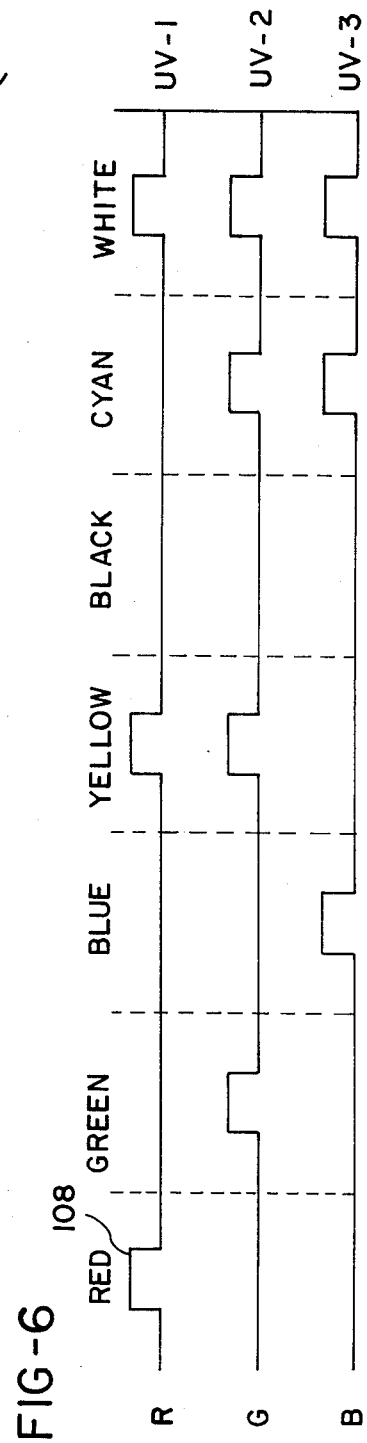
FIG. 6 shows the ultraviolet frequency bands which are transmitted onto an imaging sheet in accordance with one aspect of the present invention.

As shown in FIG. 6, positive energy is required to make the microcapsules 24 containing the three color components harden. Thus, the ultraviolet wavelengths corresponding to the color red would create a positive energy pulse 108 which would react with the cyan microcapsules. As is also shown in FIG. 6, if the color black is present on the original document, no ultraviolet frequencies are transmitted onto the imaging sheet 20, and thus, all microcapsules of all three components remain viscous and are allowed to react to form the color black. Likewise, if white were to appear on the original document, all frequencies would be reflected onto the imaging paper. Thus, the microcapsules containing all three components would become hardened and no color formers would be present upon being subjected to rupturing forces.

After exposure, images are formed by subjecting the imaging sheet 20 to a uniform rupturing force. This can be accomplished through various means. For example, as shown in FIG. 4, the imaging sheet 20 is passed through the nip 110 between a pair of pressure rollers. Alternatively, the capsules can be ruptured by abrasion means. Representative examples of abrasion means include a free particle bed in which the imaging sheet is vibrated and contacting the surface of the sheet with a magnetic brush roller or a roller having a fibrous outer surface. In the latter examples, the roller is operated at a sufficiently high angular velocity to produce a uniform shearing action across the surface of the sheet which ruptures the microcapsules. These development means are described in related U.S. Pat. No. 4,448,516 and U.S. patent application Ser. No. 670,447, filed Nov. 13, 1984, and Ser. No. 711,779, filed Mar. 14, 1985.

FIG. 1 illustrates the imaging process wherein the developer 28 is carried on the surface of the imaging sheet 20. Using a transfer system, the imaging sheet minus the developer layer is assembled with a developer sheet downstream of the exposure station and prior to rupturing the microcapsules. Of course, the present invention is applicable to these as well as any other imaging processes wherein a latent image is to be formed into a layer of microcapsules on an imaging sheet.

Having described the invention in detail and by reference to preferred embodiments thereof, it will be apparent that modifications and variations are possible without departing from the scope of the invention, which is defined in the appended claims.

What is claimed is:

1. A method for exposing an imaging sheet having a layer of microcapsules on the surface thereof to form latent images in said imaging sheet, said microcapsules containing a photosensitive composition which undergoes a change in viscosity in relation to its exposure to actinic radiation, said method comprising the steps of:
   generating a visible light signal corresponding to the latent image to be formed in said imaging sheet by illuminating an original document with a source of visible light;
   directing said visible light signal onto an image-converting light valve;
   illuminating said light valve with a source of actinic radiation, said light valve modulating said actinic radiation; and
   directing said modulated actinic radiation onto said imaging sheet to form a latent image.

2. A method for exposing an imaging sheet as claimed in claim 1 wherein said actinic radiation is within the ultraviolet frequency range.

3. A method for exposing an imaging sheet as claimed in claim 2 wherein said image converting light valve incorporates a dielectric mirror, the step of illuminating an original document with visible light is performed on one side of said image converting light valve, and the step of illuminating said image converting light valve with actinic radiation is performed on the side of said light valve opposite said one side.

4. A method for exposing an imaging sheet as claimed in claim 3 wherein the step of generating said visible light signal comprises sequentially filtering visible light reflected from said original document to sequentially generate red, green and blue light signals.

5. A method for exposing an imaging sheet as claimed in claim 4 wherein the step of illuminating said light valve with actinic radiation comprises illuminating said light valve with three distinct frequency ranges of actinic radiation synchronously with said red, green and blue light signals; and said step of directing said actinic radiation onto said imaging sheet comprises sequentially directing said distinct frequency ranges of actinic radiation onto said imaging sheet.

6. A method for exposing an imaging sheet as claimed in claim 5 wherein said light valve includes an electro-optical material which is activatable between birefringment and isotropic states.

7. A method for exposing an imaging sheet as claimed in claim 6 wherein said electro-optical material is a nematic liquid crystal.

* * * * *